United States Patent
Shirakawa et al.

(10) Patent No.: US 6,768,300 B2
(45) Date of Patent: Jul. 27, 2004

(54) APPARATUS FOR MEASURING ELECTROMAGNETIC CHARACTERISTICS

(75) Inventors: Naoki Shirakawa, Tsukuba (JP); Shinichi Ikeda, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 60 days.

(21) Appl. No.: 10/298,651

(22) Filed: Nov. 19, 2002

(65) Prior Publication Data

US 2003/0122543 A1 Jul. 3, 2003

(30) Foreign Application Priority Data

Nov. 19, 2001 (JP) ........................................ 2001-353149
Aug. 28, 2002 (JP) ........................................ 2002-248325

(51) Int. Cl.$^7$ .............................................. G01R 33/02
(52) U.S. Cl. ........................ 324/248; 324/262; 62/51.1; 505/846
(58) Field of Search ................................ 324/244, 248, 324/202, 260, 261–262; 505/845, 846, 705; 62/46.1, 51.1

(56) References Cited

U.S. PATENT DOCUMENTS

| 4,796,433 A | * | 1/1989 | Bartlett ........................ 62/47.1 |
| 5,590,533 A | * | 1/1997 | Asami et al. ..................... 62/6 |
| 2003/0184289 A1 | * | 10/2003 | Butters et al. .............. 324/248 |

FOREIGN PATENT DOCUMENTS

JP          2000241516      *  9/2000

* cited by examiner

Primary Examiner—Jay Patidar
(74) Attorney, Agent, or Firm—Oblon, Spivak, McClelland, Maier & Neustadt, P.C.

(57) ABSTRACT

An apparatus for measuring electromagnetic characteristics includes a sample rod with a sample fixed to a lower part thereof, a helium 3 refrigerator, in which the sample rod is inserted, having a main pipe that forms around the sample rod a space that is cooled by helium 3, a device for supplying helium 3 to the helium 3 refrigerator, an inner tube portion, into which the main pipe is inserted, that supports at an upper part thereof the refrigerator, an outer tube that cools an outer periphery of the inner tube with helium, a liquid helium container that supplies liquid helium to the outer tube, and a device for measuring the electromagnetic characteristics of the sample.

7 Claims, 7 Drawing Sheets

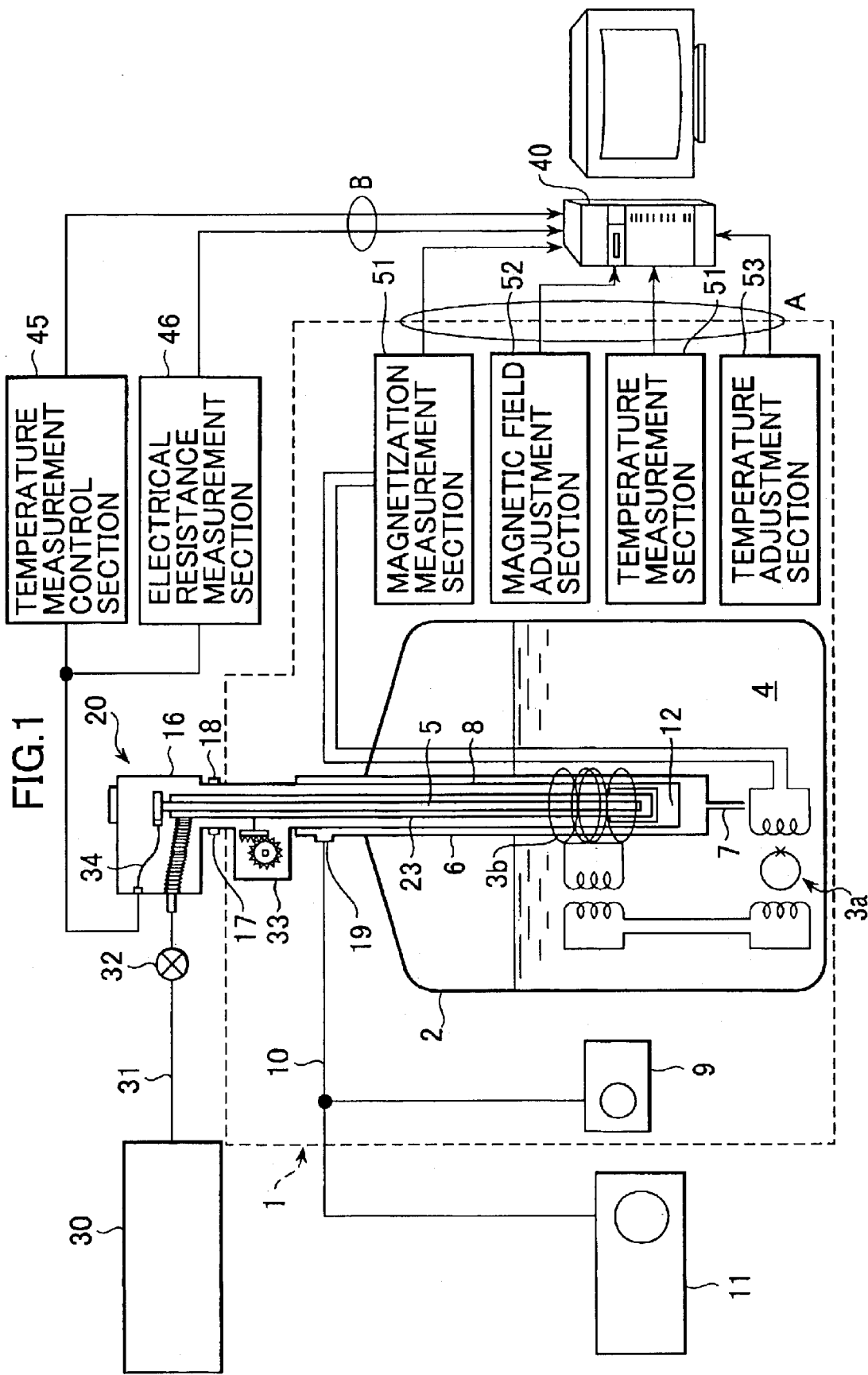

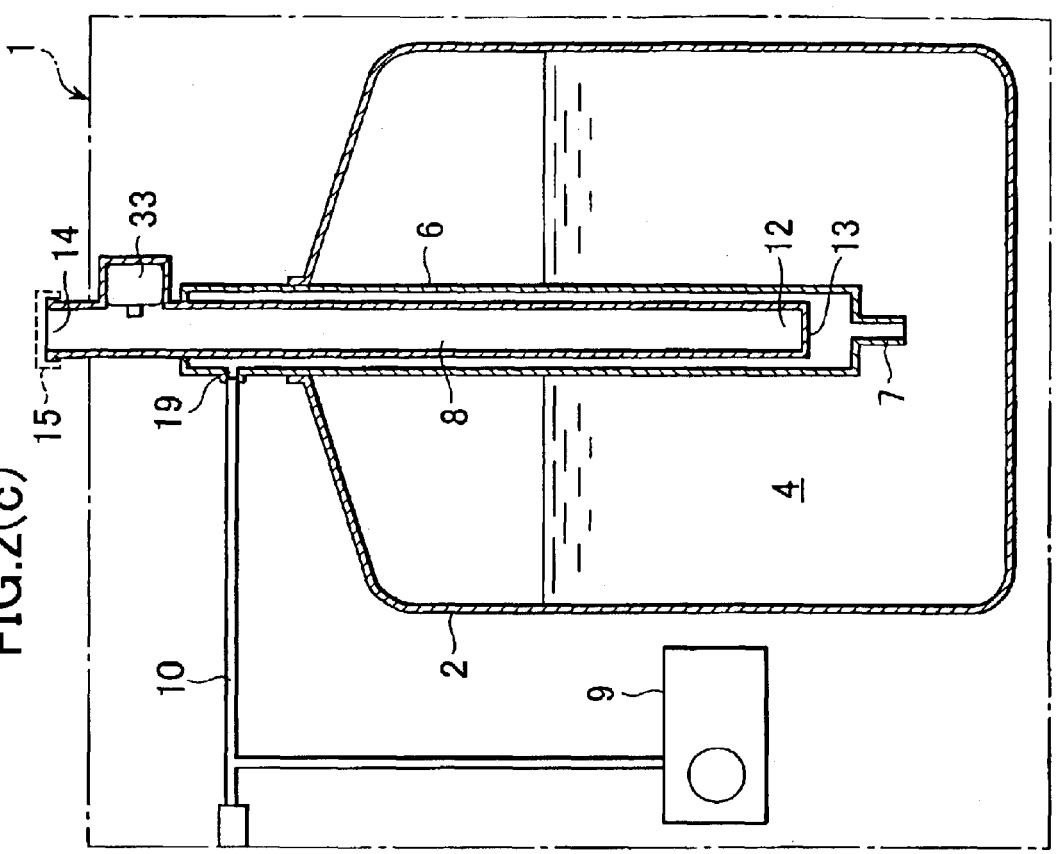
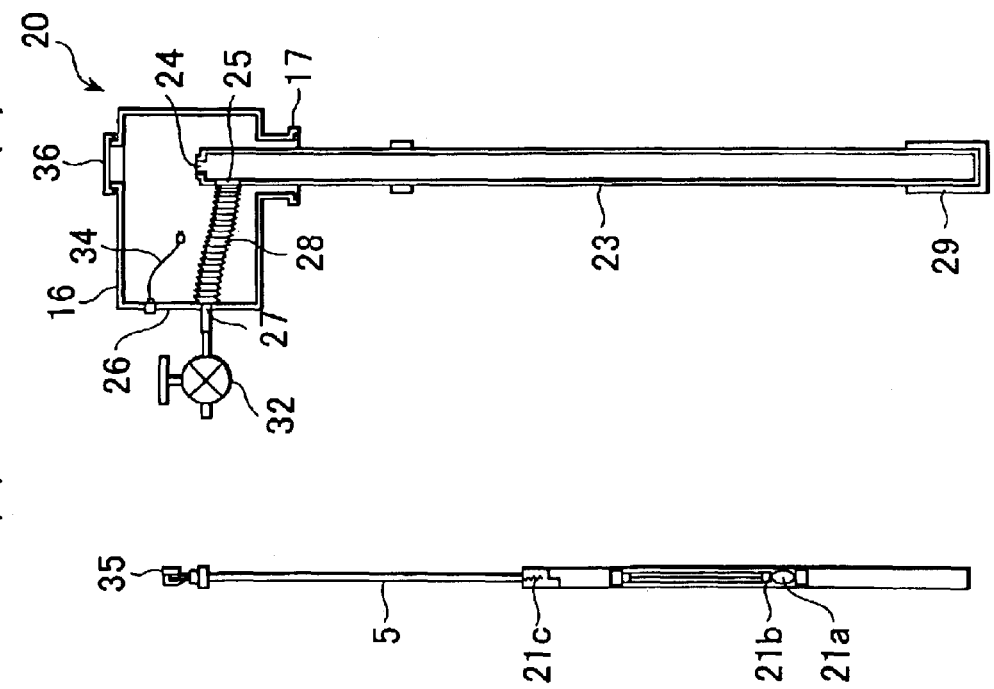

APPARATUS FOR MEASURING ELECTROMAGNETIC CHARACTERISTICS

BACKGROUND OF THE INVENTION

1. Field of the Invention

The present invention relates to an apparatus for measuring electromagnetic characteristics, such as magnetization at cryogenic temperatures, electrical resistance in a magnetic field, Hall effect and so forth. The invention particularly relates to an apparatus for measuring electromagnetic characteristics using a helium 3 refrigerator that is able to generate cryogenic temperatures down to 0.3 K and measure electromagnetic characteristics at the cryogenic temperatures, by utilizing a conventional MPMS with helium 4 that is able to generate a cryogenic temperature in the order of 1.8 K and then using helium 3 and the addition of a simple apparatus.

2. Description of the Prior Art

Magnetization measurement is an indispensable means of research into the physical properties of various materials, such as magnetic substances and superconductors. With respect to such magnetization measurement, currently the measurement apparatus called the MPMS (Magnetic Property Measurement System), made by Quantum Design Inc., of the United States, is widely used, being the de facto standard in measurement systems.

With the inclusion of a high-temperature option the MPMS is able to measure temperatures up to 800 K, but the lower limit is only 1.8 K, achieved using reduced-pressure liquid helium 4. For this reason, in making researches into specific superconductors, such as Ru or Re superconducting oxides having a superconducting transition temperature of around 1 K and various heavy-electron superconductors, that have recently attracted keen attention, the MPMS cannot be used to perform magnetization measurement. Since pNPNN that is a pure organic ferromagnetic substance developed for the first time in the world has a ferromagnetic transition temperature of 0.6 K, researches have been made using a handmade apparatus.

Since a temperature only in the order of 1.8 K can be achieved with an MPMS widely employed in the prior art, as described above, it has been unable to perform magnetization measurement in relation to the aforementioned various materials that have attracted keen attention. For magnetization measurement below 1.8 K, an apparatus has to be specially fabricated. This makes it a special-order item, which is very costly. In addition to this, its lack of general utility makes it difficult to use the manufactured apparatus in a wide range of fields.

Moreover, it is very difficult to configure such a special-order apparatus so that it can measure direct-current magnetization using a superconducting quantum interference device (SQUID), so instead it is often used to measure alternating-current magnetization. However, the low sensitivity of measurement based on alternating-current magnetization makes it impossible to directly determine the magnitude of magnetization. Furthermore, even when direct-current magnetization is measured, conventional measuring methods are used, such as the extraction method, vibrating sample method and magnetic field sweep method; measurement using a SQUID of ultrahigh sensitivity has not been possible. For these reasons, the benefits of ultrahigh sensitivity provided by using a SQUID have not been obtained.

Moreover, as the name indicates, an MPMS is essentially an apparatus for measuring magnetization at cryogenic temperatures and cannot readily be used to measure electrical resistance or Hall effect.

Thus, a main object of the present invention is to provide an apparatus for measuring cryogenic electromagnetic characteristics that is capable of high-sensitivity measurement of magnetization characteristics at a cryogenic temperature in the order of 0.3 K generated using a widely employed MPMS (Magnetic Property Measurement System).

Another object of this invention is to provide an apparatus for measuring cryogenic electromagnetic characteristics that can use the above-described MPMS to measure electrical resistance and Hall effect as well as magnetization at cryogenic temperatures.

SUMMARY OF THE INVENTION

The basic idea of the present invention is to use an auxiliary rotary pump to decrease to 1.5 K a 1.8 K space provided by an MPMS, insert therein a small, vertically-movable helium 3 refrigerator, and move the whole refrigerator vertically within a pickup coil to measure direct-current magnetization. The helium 3 refrigerator can reduce the temperature of a sample to 0.3 K. Unlike a case in which just the sample is moved up and down in liquid helium 3, moving the whole refrigerator up and down enables the sample to be maintained at a constant temperature. Based on this basic technical concept, the present invention employs the configuration described below to resolve the above problems.

That is, the apparatus for measuring electromagnetic characteristics according to this invention comprises a sample rod with a sample fixed to a lower part thereof; a helium 3 refrigerator, in which the sample rod is inserted, having a main pipe that forms around the sample rod a space that is cooled by helium 3; means for supplying helium 3 to the helium 3 refrigerator; an inner tube portion, into which the main pipe is inserted, that supports at an upper part thereof the refrigerator; an outer tube that cools an outer periphery of the inner tube with helium; a liquid helium container that supplies liquid helium to the outer tube; and means for measuring electromagnetic characteristics of the sample.

To supply helium 3 to the main pipe, the means of supplying helium 3 to the helium 3 refrigerator can be connected to the main pipe by a bellows that maintains an interior thereof in an airtight state.

The main pipe can be equipped with a vacuum insulation member for insulation from a surrounding space.

The outer tube can have main pump and auxiliary pump piping.

The apparatus for measuring electromagnetic characteristics according to the present invention can further comprise a control unit connected to the helium 3 refrigerator and the sample rod for performing magnetic field control, sample temperature control and measurement activities.

The means for measuring electromagnetic characteristics of the sample can be constituted by a pickup coil that generates an induced electromotive force that is proportional to magnetization of the sample, and a SQUID that detects the generated electromotive force, to measure the sample's magnetization.

The means for measuring electromagnetic characteristics of the sample can be constituted by a constant-current power supply that provides a flow of DC or AC measurement current between current terminals of the sample and a voltmeter for detecting differences in electrical potential between voltage terminals of the sample, to measure electrical resistance and Hall effect of the sample.

As described in the above, by utilizing an MPMS that is widely employed in the prior art, the apparatus for measuring electromagnetic characteristics according to the present invention can form a sample space inside the main pipe having a temperature as low as 0.3 K. In addition to using this to measure the magnetization of a sample, it can also be used to measure the electrical resistance and the Hall effect of the sample.

Further features of the invention, its nature and various advantages will be more apparent from the accompanying drawings and following detailed description of the invention.

BRIEF DESCRIPTION OF THE DRAWINGS

FIG. 1 is a schematic diagram showing an embodiment of an apparatus for measuring electromagnetic characteristics according to the present invention.

FIG. 2(a) is a front view of the sample rod of the apparatus of FIG. 1.

FIG. 2(b) is a partially sectioned side view of the box and main pipe of the apparatus of FIG. 1.

FIG. 2(c) is a sectional view of the main body of the apparatus of FIG. 1.

DESCRIPTION OF THE PREFERRED EMBODIMENT

Figure 3:
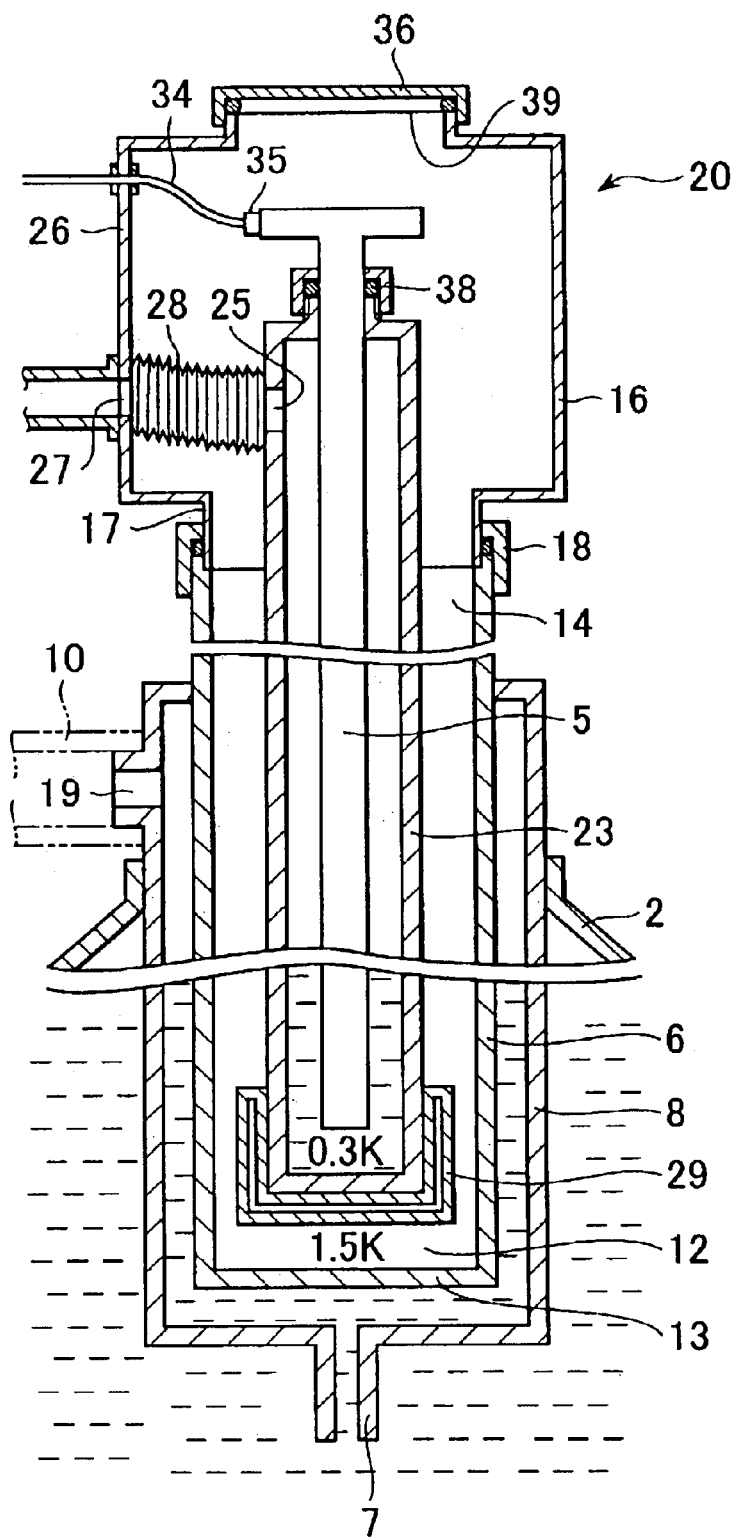
FIG. 3 is a sectional view in which the sample rod of the apparatus of FIG. 1 inserted into the main pipe is shown.

FIG. 1 shows an embodiment of an apparatus for measuring electromagnetic characteristics according to the present invention. First, an explanation will be provided with respect to measurement of magnetization. The basic configuration of the apparatus for measuring electromagnetic characteristics shown in FIG. 1 utilizes the main components of a widely used prior art apparatus for measuring electromagnetic characteristics called an MPMS. Inside the magnetization measurement apparatus 1, a helium 3 refrigerator 20, described below, is inserted into a liquid helium container 2 through an opening at the top of the container, and a sample rod 5 can be inserted into the helium 3 refrigerator 20.

The basic function of measuring magnetization in the case of this magnetization measurement apparatus comprises using a SQUID that applies a superconductor's Josephson effect to detect a tiny magnetic field generated by a magnetic sample affixed to the end of the sample rod 5. This makes it possible to measure the magnetic susceptibility and magnetization curve of a magnetic substance, and the Meissner effect of a superconductor sample.

Details of the MPMS magnetization measurement apparatus 1, helium 3 refrigerator 20 and so forth are shown in FIG. 2, and FIG. 3 shows an enlarged view of part of the apparatus. The liquid helium container 2 contains liquid helium 4. A cylindrical outer tube 6 extends down into the container 2, suspended from the mouth of the container. At the bottom end of the outer tube 6 is a fine, open tube 7 that extends into the liquid helium 4 stored in the liquid helium container 2.

The outer tube 6 has a pump connection port 19, located on a side wall of a part of the outer tube 6 that extends up out of the liquid helium container 2. The MPMS has a main pump 9, which is connected to the pump connection port 19 by a pipe 10. As shown in FIG. 1, an auxiliary pump 11 located outside the apparatus 1 is also connected to the pipe 10. As described later, operating the auxiliary pump 11 in conjunction with the main pump 9 makes it possible to achieve a lower temperature in a sample chamber 12.

A sample-chamber inner tube 8 is provided inside the outer tube 6. At its upper end, the inner tube 8 projects up from the end of the outer tube 6. At the upper end of the inner tube 8 is an opening 14 used to insert the sample. Directly below the opening is a valve (not shown) for closing off the measurement space from the atmosphere. A drive means 33 engages with the projecting part of a main pipe 23 to vertically move the main pipe 23 and the sample rod 5. The opening 14 can be closed with a cap 15 shown in FIG. 2(c), and a seal member 18 with good sealing properties, such as a Wilson seal, can be used for the connection with an opening 17 at the lower end of a box 16 constituting the helium 3 refrigerator 20, as shown in FIG. 2(b). With a Wilson seal, tightening the screws tightens the O-ring on the pipe, forming a vacuum seal. The seal portion is not limited to a Wilson seal system, and may be constituted with flanges and O-ring gaskets.

As shown in FIG. 2(a), measurement members 21, such as a sample 21a, a heater 21c and a temperature sensor 21b, are fixed to the lower part of the sample rod 5 which, by opening a cap 36 on the helium 3 refrigerator 20, shown in FIG. 2(b), can be inserted into the main pipe 23 via a sample-rod insertion opening 24 formed at the top of the main pipe 23. When the sample rod 5 is thus inserted into the main pipe 23, a good seal can be formed using a seal member 38, such as a Wilson seal, provided on the portion of the opening 24. In the illustrated embodiment, a vacuum insulation member 29 is provided around the lower end of the main pipe 23 to insulate the interior of the main pipe 23 from the space of the sample chamber 12.

As shown in FIG. 2(b) and FIG. 3, in the helium 3 refrigerator 20, an opening 25 provided on the upper sidewall of the main pipe 23 is connected to an opening 27 on a side wall 26 of the box 16 by a bellows 28, and a helium 3 gas-handling system 30 evacuates the main pipe 23, introduces the helium 3 into the main pipe 23 and effects pressure reduction by drawing off vaporized helium 3, as described later. The helium 3 gas-handling system 30 and opening 27 are connected with a pipe 31 that has a valve 32.

The main pipe 23 is movable with respect to the box 16, which makes it possible to have the drive unit 33 move the main pipe 23 vertically with respect to the box 16 affixed to the inner tube 8 of the magnetization measurement apparatus 1. When the sample rod 5 is moved vertically during measurement, a SQUID 3a detects an induced electromotive force generated in a pickup coil 3b wound around the outside surface of the outer tube 6, which force is proportional to the sample magnetization.

As shown in FIG. 2(b), a signal line 34 that extends inwardly from the side wall 26 of the box 16 connects with a connector 35 provided on the top of the sample rod 5 when the sample rod 5 is inserted into the main pipe 23, as shown in FIGS. 1 and 3. As a result, as shown in FIG. 1, the sample rod 5 and a control unit 40 can exchange signals via a temperature measurement control section 45 and an electrical resistance measurement section 46. The magnetic field and temperature in the MPMS magnetization measurement apparatus 1 are also controlled by means of the control unit 40.

Figure 4:
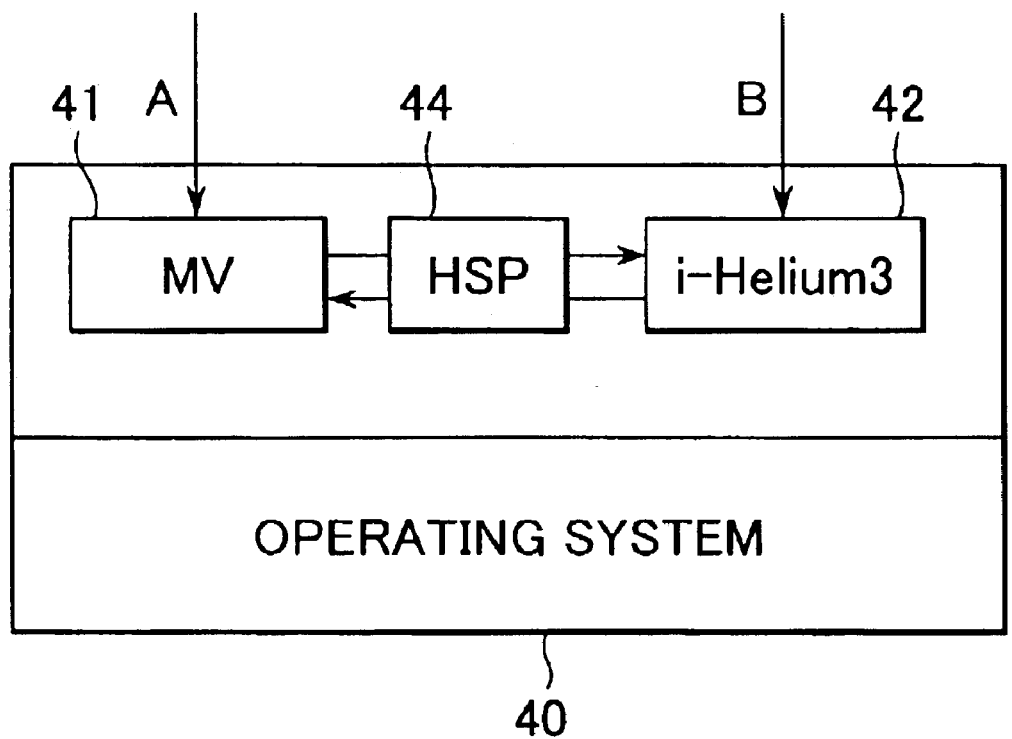
FIG. 4 is a drawing used to explain the software used to control the apparatus of FIG. 1.

As shown in FIG. 4, the control unit 40 has MV (Multi-View) software 41 that is existing software for controlling the MPMS magnetization measurement apparatus 1. The control unit 40 also has software 42 denoted in the drawing as i-Helium3 that in the present invention is used for measuring magnetization in the temperature range of 0.3 to 2 K using the helium 3 refrigerator 20.

The i-Helium3 software 42 can independently handle the input/output of the sample 21a, temperature sensor 21b and heater 21c on the sample rod 5, and also handles the basic measurement data input beforehand by an operator as measurement operation commands that enables the apparatus for measuring electromagnetic characteristics to perform prescribed operations. During a measurement operation, i-Helium3 software commands run the MV software 41 via HSP software 44, which is currently widely used. In the MPMS magnetization measurement apparatus 1, magnetic field control, measurement of sample magnetization, processing of sample magnetization measurement signals and so forth are carried out in accordance with the control routines of the MV software 41.

The apparatus for measuring electromagnetic characteristics according to the present invention is thus comprised by combining the above components. Using the apparatus starts with the component parts as shown in FIG. 2. First, a sample is affixed to the sample rod 5 to which a temperature sensor and heater have been attached, as shown in FIG. 2(a). With reference to FIG. 2(b), the cap 36 on the box 16 is opened and the sample rod 5 is inserted into the opening 24 of the main pipe 23 and the seal member 38, such as a Wilson seal or the like, is used to effect a secure seal at the top part of the main pipe 23, as shown in FIG. 3.

The connector of the signal line 34 projecting into the interior of the box 16 connects with the connector 35 at the top of the sample rod 5. Sample temperature measurement and control are effected via the signal line 34. Next, the cap 36 is closed to seal the interior.

Then, under the MV software constituting the MPMS control software of the control unit 40 the sample space is warmed to 300 K and a vent valve is opened, allowing a helium gas curtain to form, and the cap 15 on the opening 14 at the top of the inner tube 8 is opened. The main pipe 23 of the helium 3 refrigerator 20, with the sample rod 5 inserted therein, is inserted into the opening 14 until the lower opening 17 of the box 16 abuts against the opening 14, and the seal member 18 is used to effect a seal. Concerning the seal member 18, the standard seal of the MPMS does not provide an adequate sealing capability, so in order to improve the sealing capability, a Wilson seal is used instead.

The valve 32 is opened and the helium 3 gas-handling system 30 is used to evacuate the interior of the main pipe 23 to a high vacuum while, under the MV software 41 of the control unit 40, the main pump 9 is operated to cool the sample space to 1.8 K. The temperature of the sample space can be reduced to around 1.5 K by also operating the auxiliary pump 11, such as a rotary pump or the like.

When the helium 3 gas-handling system 30 introduces helium 3 gas ($^3$He gas) into the main pipe 23 via a liquid nitrogen trap, the helium 3 gas liquefies and collects at the bottom of the main pipe 23. After the liquefied helium 3 gas has reached a predetermined amount, the helium 3 gas-handling system 30 uses a closed evacuation system to evacuate the helium 3 gas in the main pipe 23, which makes it possible to maintain a low temperature of 0.3 K around the sample on the sample rod 5.

Following this, the operator obtains data through the function of the MPMS measurement software while controlling the temperature and magnetic field of the sample as he or she wishes. In the course of this, the software of the control unit 40 shown in FIG. 1 is used to control the overall operation of the apparatus for measuring electromagnetic characteristics.

The i-Helium3 has two functions. These are i) to measure and control the temperature in the main pipe 23, and ii) to indirectly control the MV via the HSP to automatically acquire magnetization data. Even with just function i), the operator can perform measurements by directly operating the MV, but this is very inconvenient when it is desired to acquire a lot of data, so function ii) is added. That is, the operator instructs the i-Helium3 to make necessary changes to the temperature and magnetic field. The i-Helium3 produces the required temperature point by controlling a resistance bridge equipped with a PID temperature controller, and produces the necessary magnetic field by indirectly controlling the MV via the HSP. The i-Helium3 then controls the MV indirectly to vertically move the helium 3 refrigerator 20 by means of the drive unit 33, to acquire magnetization data.

Next, using the above apparatus for measuring electromagnetic characteristics to measure electrical resistance and Hall effect will be described.

To use the apparatus of FIG. 1 to measure electrical resistance and Hall effect at cryogenic temperatures, measurement lead-wires are attached to a sample 21a which is affixed to the lower part of a sample rod used for measuring electrical resistance and Hall effect so that a magnetic field can be applied in a required direction with respect to the sample, and the sample rod 5 is inserted into the main pipe 23 via the opening 24 and sealed in place using the seal member 38.

Other than having wires running from top to bottom for measuring the resistance and Hall effect, the sample rod is substantially the same as the sample rod 5 used for measuring magnetization shown in FIG. 2(a).

For setting the required measurement conditions, the magnetization measurement apparatus 1 is provided with a magnetic field adjustment section 52, a temperature measurement section 53 and a temperature adjustment section 54. The data measured are received from a magnetization measurement section 51, the temperature measurement section 53 and so forth; the predetermined magnetic field state can be maintained by the magnetic field adjustment section 52; and the predetermined temperature state can be maintained by the temperature adjustment section 54.

The electrical resistance measurement section 46 includes a constant-current power supply for providing a flow of DC measurement current between the current terminals of the sample, a digital voltmeter for detecting differences in electrical potential between the voltage terminals of the sample, and a switching system to connect and switch among a plurality of samples. Thus, any of a plurality of samples affixed to the sample rod 5 can be selected, and the system can acquire measurement data by switching to any of a plurality of temperature sensors provided at each location on the rod 5. This switching and selection is performed automatically by means of program software stored in the control unit 40. The aim of using a plurality of samples is to increase experimental efficiency by measuring a plurality of samples cooled at one time.

In the case of the present invention, the above apparatus can be used to fix the magnetic field and measure temperature-based changes in electrical resistance, maintain a set temperature while measuring magnetic-field-based changes in electrical resistance, the Hall effect, and various other types of measurements. These measurements will now be explained with reference to the operational flow charts of FIGS. 5 to 7.

Figure 5:
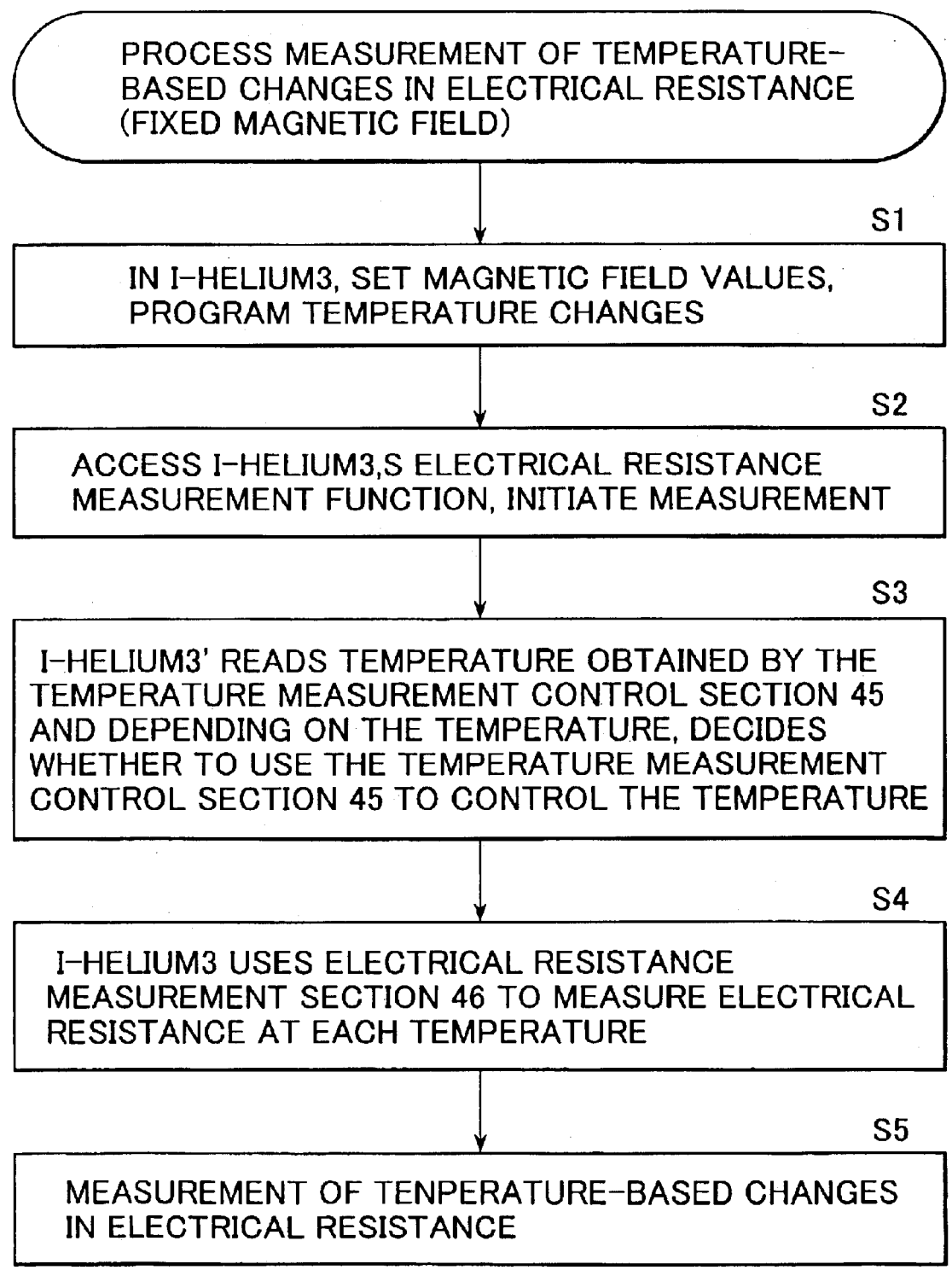
FIG. 5 is a flow chart of the process of measuring temperature-based changes in electrical resistance, using the apparatus of FIG. 1.

The above apparatus can be used to fix the magnetic field and measure temperature-based changes in electrical resistance by following the flow of operations shown in FIG. 5, for example. The process of measuring the effect temperature has on the electrical resistance with the magnetic field fixed at a predetermined value starts by using the i-Helium3 software of the control unit 40 to set the magnetic field at the required value, and programming the desired temperature changes (step S1).

Next, the resistance measurement function of the i-Helium3 is accessed, measurement conditions are input and measurement is initiated (step S2). The i-Helium3 reads temperature obtained by the temperature measurement control section 45 and depending on the measurement temperature region, decides either to use the temperature measurement control section 45 to control the temperature or to use the temperature adjustment section 54 in the apparatus 1 to control the temperature. If the temperature adjustment section 54 is used, the command flow is i-Helium3 (42)→HSP (44)→MV (41)→temperature adjustment section (54) (step S3). Next, the i-Helium3 uses the electrical resistance measurement section 46 to measure the electrical resistance at each temperature (step S4). Continuously measuring the electrical resistance in this way makes it possible to measure the correspondence between electrical resistance characteristics and temperature (step S5). Thus, with this apparatus, the temperature can be separately monitored and temperature changes in the sample space directly detected for automatic data acquisition.

Figure 6:
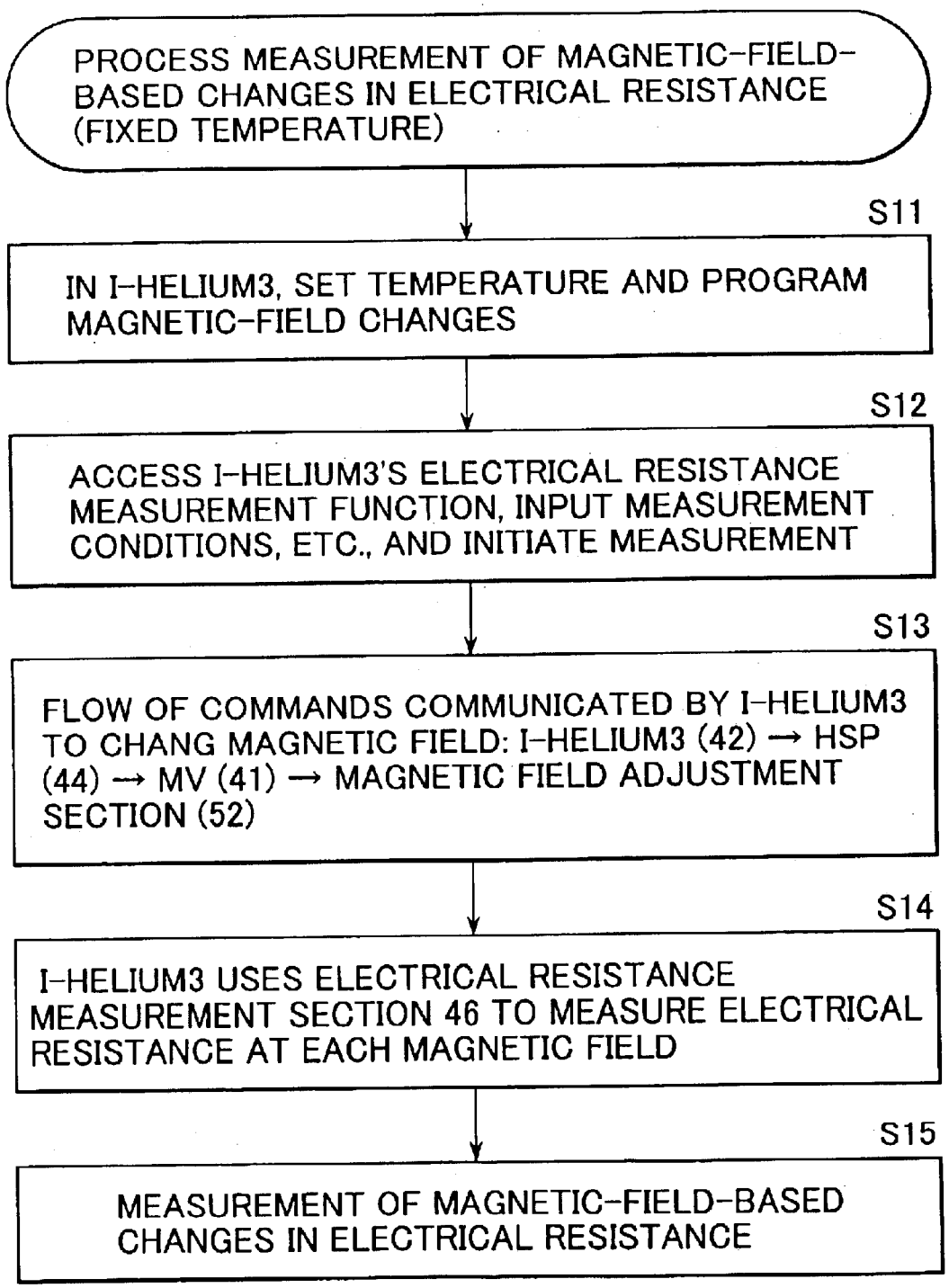
FIG. 6 is a flow chart of the process of measuring magnetic-field-based changes in electrical resistance, using the apparatus of FIG. 1.

Next, to maintain a set temperature while measuring how changes in the magnetic field affect electrical resistance, as shown in FIG. 6, for example, first the temperature is set in the i-Helium3 and the required magnetic-field changes are programmed (step S11). Next, the electrical resistance measuring function of the i-Helium3 is accessed, and the temperature is input and the measurement initiated (step S12). This gives rise to the command flow i-Helium3 (42)→HSP (44)→MV (41)→magnetic field adjustment section (52) (step S13). The i-Helium3 then uses the electrical resistance measurement section 46 to measure the electrical resistance at each magnetic field (step S14), to measure the correspondence between electrical resistance characteristics and magnetic field (step S15).

Figure 7:
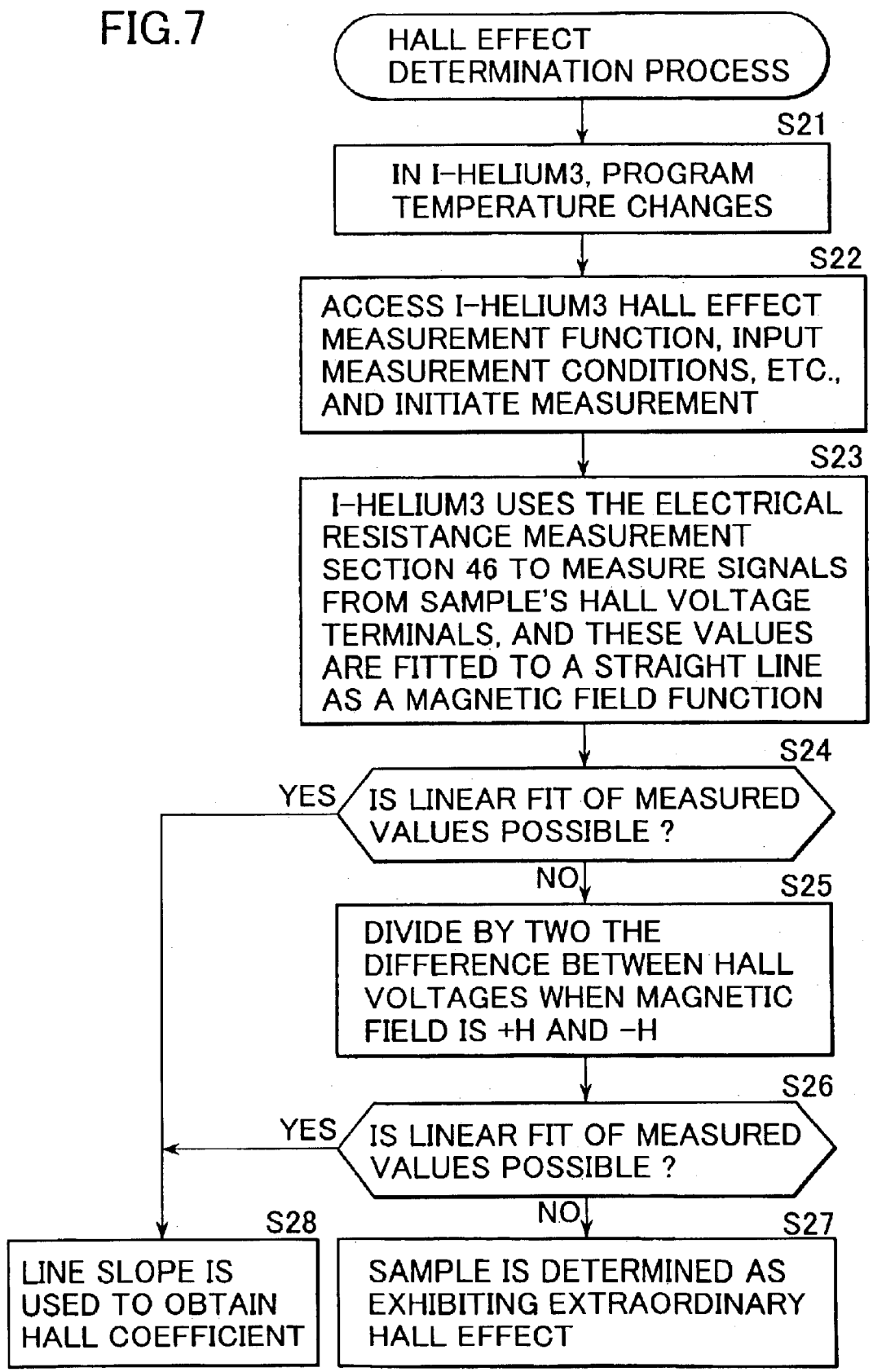
FIG. 7 is a flow chart of the process of determining Hall effect, using the apparatus of FIG. 1.

Next, FIG. 7 shows an example of a process used for determining a Hall effect, which starts by using the i-Helium3 to program the temperature changes (step S21).

Next, the Hall effect measuring function of the i-Helium3 is accessed and measurement conditions are input to initiate the measurement (step S22). If Ho is the strongest magnetic field used for taking measurements, using a fixed base temperature, the i-Helium3 Hall effect measurement function changes the magnetic field in $0.1H_0$ steps, going from $-H_0$ to $-0.9H_0$ to $-0.8H_0$, up through OT to $+H_0$. During this, the i-Helium3 Hall effect measurement function uses the electrical resistance measurement section 46 to measure the signals from the sample's Hall voltage terminals in the magnetic field at each step, and the measured values are fitted to a straight line as a function of the magnetic field (step S23).

Next, it is determined whether or not the measured values could be fitted to a straight line (step S24). If it is determined that a linear fit could be achieved, the process moves to step S28 to obtain the Hall coefficient from the slope of the line. If it is determined in step S24 that the values cannot fit in a straight line, the difference between the Hall voltages at magnetic field values of +H and −H is divided by two (step S25).

Next, it is determined whether or not the values thus obtained could be fitted to a straight line (step S26). If it is determined that a linear fit could be achieved, in the same manner as before, the process moves to step S28 to obtain the Hall coefficient from the slope of the line. If it is determined that the values cannot fit in a straight line, it is determined that the sample exhibits an extraordinary Hall effect (step S27). In this way, the effect that temperature has on the Hall coefficient can be measured.

While the above explanation has been made with reference to a standard measurement system that combines a constant-current power supply and a digital voltmeter, as a modification thereof, a system could be used that employs an alternating-current resistance bridge.

As revealed by the foregoing explanation, by utilizing an MPMS that is widely employed in the prior art, the apparatus for measuring electromagnetic characteristics according to the present invention can form a sample space within the main pipe having a temperature as low as 0.3 K. In addition to using this to measure magnetization as described above, it can also be used in a more general-purpose way, such as for measuring electrical resistance and Hall effects, for example.

What is claimed is:

1. An apparatus for measuring electromagnetic characteristics, comprising:

a sample rod with a sample fixed to a lower part thereof, a helium 3 refrigerator, in which the sample rod is inserted, having a main pipe that forms around the sample rod a space that is cooled by helium 3;

means for supplying helium 3 to the helium 3 refrigerator;

an inner tube portion, into which the main pipe is inserted, that supports at an upper part thereof the refrigerator;

an outer tube that cools an outer periphery of the inner tube with helium;

a liquid helium container that supplies liquid helium to the outer tube; and means for measuring electromagnetic characteristics of the sample.

2. The apparatus for measuring electromagnetic characteristics according to claim 1, wherein to supply helium 3 to the main pipe, the means of supplying helium 3 to the helium 3 refrigerator is connected to the main pipe by a bellows that maintains an interior thereof in an airtight state.

3. The apparatus for measuring electromagnetic characteristics according to claim 1, wherein the main pipe is equipped with a vacuum insulation member for insulation from a surrounding space.

4. The apparatus for measuring electromagnetic characteristics according to claim 1, wherein the outer tube has main pump and auxiliary pump piping.

5. The apparatus for measuring electromagnetic characteristics according to claim 1, further comprising a control unit connected to the helium 3 refrigerator and the sample rod for performing magnetic field control, sample temperature control and measurement activities.

6. The apparatus for measuring electromagnetic characteristics according to claim 1, wherein the means for measuring electromagnetic characteristics of the sample is constituted by a pickup coil that generates an induced electromotive force that is proportional to magnetization of the sample, and a SQUID that detects the generated electromotive force, to measure the sample's magnetization.

7. The apparatus for measuring electromagnetic characteristics according to claim 1, wherein the means for measuring electromagnetic characteristics of the sample is constituted by a constant-current power supply that provides a flow of DC or AC measurement current between current terminals of the sample and a voltmeter for detecting differences in electrical potential between voltage terminals of the sample, to measure electrical resistance and Hall effect of the sample.

* * * * *